United States Patent [19]

Breese

[11] 4,388,967

[45] Jun. 21, 1983

[54] SOLDERABLE MOUNTING STAKES FOR HEAT SINKS

[75] Inventor: Leonard S. Breese, Duncanville, Tex.

[73] Assignee: Thermalloy Incorporated, Dallas, Tex.

[21] Appl. No.: 183,240

[22] Filed: Sep. 2, 1980

[51] Int. Cl.³ .............................. F28F 7/00; F28F 9/00
[52] U.S. Cl. ................................... 165/80 B; 165/185; 174/16 HS; 357/81; 361/386; 248/316 D
[58] Field of Search ............ 174/16 HS; 165/DIG. 3, 165/80 B, 80 R, 185; 248/316 D, 459; 357/81, 40; 361/386

[56] References Cited

U.S. PATENT DOCUMENTS

| | | | |
|---|---|---|---|
| 2,109,770 | 3/1938 | Franklin | 339/258 P |
| 2,947,964 | 8/1960 | Johanson et al. | 339/258 P |
| 3,118,998 | 1/1964 | Mastney | 339/258 R |
| 3,312,227 | 4/1967 | Chitouras et al. | 357/81 |
| 3,376,920 | 4/1968 | Lazarus et al. | 165/185 |
| 3,694,703 | 9/1972 | Wilens et al. | 357/81 |
| 3,818,423 | 6/1974 | McDonough | 339/258 P |
| 4,034,469 | 7/1977 | Koopman et al. | 174/16 HS |
| 4,054,901 | 10/1977 | Edwards et al. | 174/16 HS |
| 4,142,771 | 3/1979 | Barnes et al. | 174/84 C |

FOREIGN PATENT DOCUMENTS 807721 11/1959 United Kingdom ............ 248/316 D

OTHER PUBLICATIONS

Insulation and Circuits, p. 56, Jul. 1978.
Aham Catalog, p. 15.

Primary Examiner—William R. Cline
Assistant Examiner—John M. Kramer
Attorney, Agent, or Firm—Kanz & Timmons

[57] ABSTRACT

Disclosed is a solderable stake for attaching a heat sink to a mounting board such as a circuit board or the like. The stake is a unitary body having a shank supporting a transverse base with parallel spaced apart fingers extending from the base cooperating with the base to define a channel. The stake body is tin-plated. The edge of the heat sink is inserted into the channel between the fingers and retained therein by the spring-clip action of the fingers. The assembly may be attached to the circuit board by conventional soldering simultaneously with soldering of other component leads and the like.

7 Claims, 5 Drawing Figures

SOLDERABLE MOUNTING STAKES FOR HEAT SINKS

This invention relates to apparatus for dissipation of thermal energy generated by semiconductor devices. More particularly, it relates to heat sink apparatus designed to mount semiconductor encasement structures and packages on circuit boards and the like and dissipate thermal energy generated by such semiconductor devices into the surrounding environment.

many semiconductor devices generate heat during operation which heat must be dissipated to avoid damage to the semiconductor component. In some devices the heat generated is sufficiently dissipated by the enclosure, header or leads. Other devices may be mounted on heat sinks comprising bodies of thermally conductive materials such as copper, aluminum or the like which dissipate the thermal energy generated by the devices into the surrounding environment. Such heat sinks may be extruded, machined or sheet metal bodies including heat dissipating fins or the like.

Many semiconductor encapsulation packages are provided with a thermal transfer plate integrally formed in the package to transfer thermal energy from the active semiconductor component to external thermal energy dissipating apparatus. Generally, the encapsulation package comprises a plastic body with leads extending from one end thereof and a thermal transfer plate which may be a metal tab or the like extending from the opposite end of the plastic body. Sometimes a relatively large thermal transfer plate may be integrally formed in the plastic body adjacent or forming one major face thereof. The thermal transfer plate may, as in the case of the TO-220 plastic power device case, form one major face of the plastic body and extend parallel thereto for a distance beyond the end of the plastic body. Such packages are designed for use in connection with external heat dissipators which are connected to the thermally conductive heat transfer plate. Accordingly, the thermal energy transfer plate of heat conductive tab is frequently provided with means, such as a hole or the like, for attaching the tab to a thermal energy dissipating device, commonly referred to as a heat sink, the dimensions and configuration of which are determined by the intended use and environment of the semiconductor device and the material of the heat sink.

Conventionally, the heat sink to which the semiconductor package is attached is formed from sheet metal and has a generally flat base portion to which the thermal transfer plate is secured to provide broad-area intimate contact and also has a plurality of fins or the like extending therefrom which dissipate heat into the surrounding environment. When the semiconductor package and heat sink are to be attached to a circuit board or the like, it is often desirable and advantageous to premount the device package on the heat sink and thereafter mount the package and heat sink assembly on the circuit board in an upright positon with the flat base of the heat sink parallel with the leads of the semiconductor device and perpendicular to the mounting surface of the circuit board. This arrangement not only saves time in mounting the devices, but provides maximum utilization of space on the mounting board surface, avoids bending the leads on the semiconductor device, and permits the heat sink to extend further from the board surface to aid in heat dissipation. However, since the thermal transfer plate often must be grounded and since the upright heat sink must be rigidly attached to the circuit board, means must be provided to secure the heat sink to the circuit board. Accordingly, some prior art heat sinks are provided with integrally formed or permanently attached stakes or mounting pins extending therefrom parallel with the leads extending from the device package. These stakes mate with corresponding eyelets or holes in the circuit board. Therefore, when the pre-assembled device package and heat sink are mounted on the circuit board, the stakes may be attached to the board in the same soldering operation which solders the device leads to the circuit pattern on the circuit board.

It will be readily recognized, however, that since the stakes are soldered to the circuit board to provide a rigid connection thereto, the stakes must be pre-tinned in order to assure that a reliable soldered connection is formed. Accordingly, heat sink devices which utilize integrally formed mounting stakes and the like are usually completely pre-tinned since it is difficult to pre-tin only the stake and less expensive, when considering the handling operations involved, to pre-tin the entire heat sink than to attempt to tin only the stake portions extending from a unitary device. However, pre-tinning the entire heat sink is functionally unnecessary since only the stakes need be tinned and tinning is an expensive operation. Accordingly, it would be advantageous to provide pre-tinning only for the stakes.

In accordance to the present invention, pre-tinned stakes are provided which may be attached to anodized, untreated or otherwise treated heat sinks as desired, thereby permitting conventional heat sinks to be mounted vertically while eliminating the cost of pre-tinning the entire heat sink. The pre-tinned stakes are formed from a sheet or ribbon of suitable material which is then cut and formed into a unitary body comprising a substantially cylindrical pin or shank supporting a base with fingers extending therefrom to define a channel to receive the heat sink. The stake is then attached to the heat sink by inserting the edge of a fin of the heat sink into the channel. The heat sink is retained in the channel by barbs, detents or other means to secure the assembly rigidly together. Accordingly, conventional anodized, untreated or otherwise treated heat sinks may be mounted vertically and attached to circuit boards and the like by soldering utilizing the pre-tinned or tin-plated clip-on stake tabs of the invention, resulting in less expensive vertically mounted heat sink assemblies. Furthermore, heat sinks of standard configuration may be converted to vertically mounted heat sinks by simply inserting the edge or a fin of the heat sink in the pre-tinned stake tab, thus permitting vertical mounting of various standard designs of heat sinks while eliminating the cost of pre-tinning the heat sink body.

Other featurs and advantages of the invention will become more readily understood from the following detailed description taken in connection with the appended claims and attached drawings in which:

Figure 1:
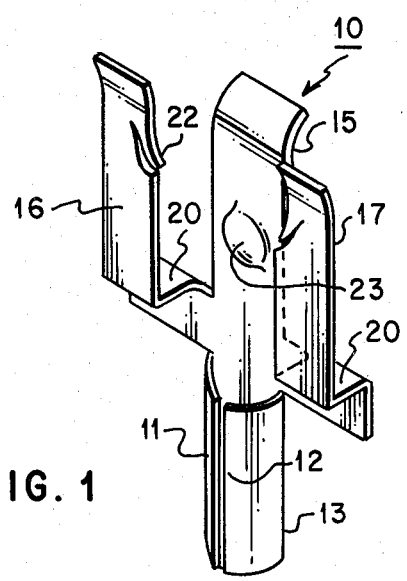
FIG. 1 is a perspective view of the preferred embodiment of the solderable mounting stake of the invention.
Figure 2:
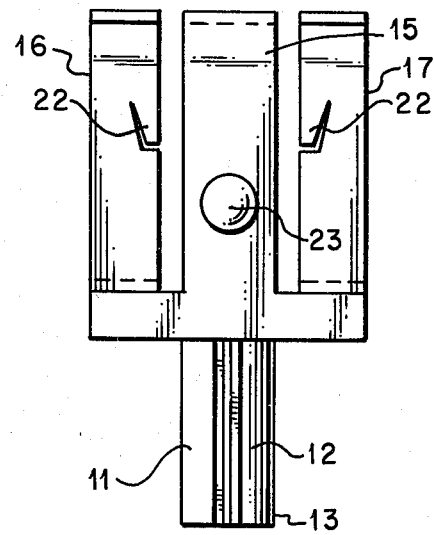
FIG. 2 is an elevational view of the stake shown in FIG. 1.
Figure 4:
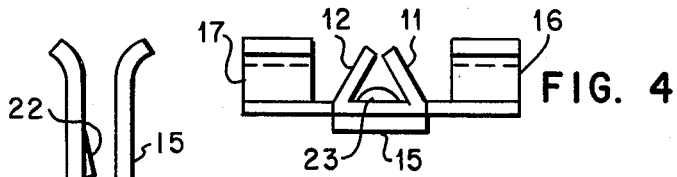
FIG. 4 is an end view thereof.
Figure 3:
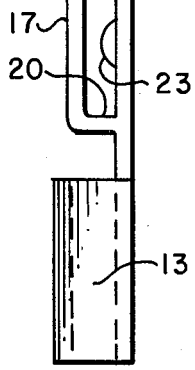
FIG. 3 is a side view thereof.

An exemplary embodiment of the stake of the invention is illustrated in FIG. 1 and identified by the reference numeral 10. The stake comprises a unitary body of material formed from a generally flat metal blank. In the preferred embodiment, cuts are formed extending from opposite lateral edges of the flat blank toward the center thereof to form tabs 11 and 12 which are then rolled or folded toward the central portion to form a substantially cylindrical pin or shank 13. Parallel cuts are formed in the end of the blank opposite the shank 13 and parallel with the axis of the shank 13 to form a plurality of fingers. In the embodiment illustrated, two cuts are formed; thus a central finger 15 and two outer fingers 16 and 17 are defined. In the embodiment illustrated, the two outer fingers 16 and 17 are folded approximately 90° from the axis of the shank 13 to form a base 20 transverse to the axis of the shank 13. The portions of the fingers extending past the base portion 20 are folded approximately 90° from the base 20 parallel with and spaced from the central finger 15. Thus the fingers 15, 16 and 17 and the base 20 define a channel adapted to receive the edge or a fin of a suitable heat sink. The width of the base 20, which determines the width of the channel, may be varied as required to match the thickness of the heat sink to which the stake is to be attached. The ends of the fingers may be flared or curved outwardly from the channel to aid in insertion of the heat sink therebetween.

In the preferred embodiment, one or more of the fingers may have diagonal cuts formed therein to define barbs 22 extending from the fingers into the channel. Such barbs or other retaining means engage the heat sink and aid in retaining the heat sink body rigidly and securely fixed within the channel. Similarly, detents or dimples 23 may be formed in one or more of the fingers to engage depressions, slots or the like formed in the heat sink to alternately or further aid in rigidly securing the heat sink within the channel.

The stake defined hereinabove may be formed by conventional metal forming techniques from any suitable sheet or ribbon material such as aluminum alloys, steel alloys or various other suitable materials. The material must exhibit sufficient strength and resiliency to permit the fingers to act as spring clips and firmly grasp the heat sink therebetween. Furthermore, at least the shank portion 13 should readily accept a solder bond. In the preferred embodiment, the entire stake is clad with a solderable coating material which promotes the formation of solder bonds such as tin or a tin-lead alloy. Since tin-lead alloys are commonly used as solder materials, the coating may be either tin or a tin-lead alloy or other suitable solder promoting materials such as a solder flux. It is, of course, common practice to pre-clad materials which are to be soldered with solder-promoting materials such as tin, tin-lead alloys or flux materials. The pre-clad material may be applied by conventional pre-tinning or by plating or the like. Such pre-clad is conventionally referred to as "pre-tin" regardless of the compositon of the material or the process by which it is applied and the terms "pre-tinned," "pre-tin," "tin-plated," "tin-coated" and the like are used interchangeably herein to refer to solderable or solder-promoting coatings regardless of the actual composition of the coating or the manner by which the coating is applied. Furthermore, the stake may be pre-tinned after the unitary stake body is formed as described above or the stake may be formed from pre-tinned blank stock. In the preferred embodiment of the invention, the stake is formed by metal stamping using conventional spring steel and the stamped parts are thereafter tin-plated.

Figure 5:
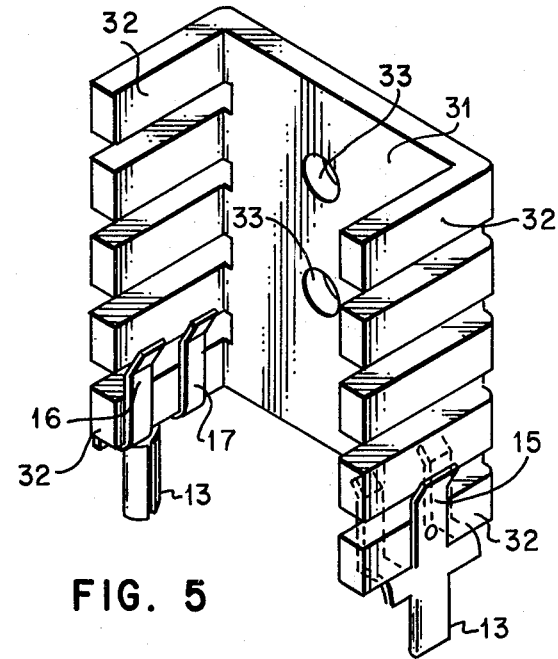
FIG. 5 is a perspective view of a heat sink assembly employing the preferred embodiment of the solderable mounting stake of the invention.

The solderable stake of the invention may be used in connection with a wide variety of conventional heat sink structures to form solderable tab heat sink assemblies. A typical assembly is illustrated in FIG. 5 wherein the heat sink comprises a body of thermally conductive material having a generally flat rectangular portion or base plate 31 with fins 32 extending perpendicularly from two opposite edges thereof. The base plate 31 is provided with apertures 33 through which bolts or the like may be inserted to affix the thermal transfer plate of a semiconductor device package in contact with the base plate 31. The thermal transfer plate may thus be secured adjacent and in broad-area intimate contact with the base plate 31 with its leads extending from the enclosure and projecting vertically in a plane parallel with the plane of the base plate 31. Thus the leads may be readily inserted into corresponding eyelets in a circuit board (not shown) to mount the semiconductor device and heat sink vertically. In order to convert the conventional heat sink illustrated into a vertically mountable heat sink, solderable stakes 10 as described above are attached to the fins 32 on the end of the heat sink. It will be appreciated that the stakes 10 may be mounted at any desired location on the fins 32 or the lower edge of the base plate 31 so that the shanks 13 will extend parallel with the base plate 31 and align with holes or eyelets in the mounting board. Furthermore, the stakes 10 may be attached to the heat sink either before or after the semiconductor device package is attached to the heat sink.

The stakes 10 are attached to the heat sink by simply inserting the edges of the fins 32 into the channel between the fingers of the stakes. The width of the base 20 is preferably coincident with the thickness of the fins 32 so that the fin 32 is snugly nested within the channel. Where conventional heat sinks are employed, the width of the fin 32 is known, thus the distance from the base 20 to the barb 22 is any made to match the width of the fin. Accordingly, the barbs 22 extending inwardly from the fingers will engage the top edge of the fin 32 when the fin 32 is fully inserted into the channel, thereby locking the fin within the channel. Similarly, a depression, slot or the like (not shown) may be formed in the fin to mate with the detent or dimple 23 to further aid in securing the fin within the channel. The stakes, therefore, are securely physically attached to the heat sink and are also in electrical contact therewith. Accordingly, the entire assembly, including the heat sink, the semiconductor enclosure device and the mounting stakes may be mounted on a circuit board or the like by simply simultaneously inserting the shanks 13 and the leads extending from the enclosure device into appropriate eyelets in the mounting board. Since the shanks 13 are pre-tinned, the entire assembly may be physically and electrically attached to the circuit board in a single operation, such as by wave soldering or the like.

It will be appreciated that the solderable stake described above may be attached to the heat sink manually or with suitable automated equipment. The spring action of the resilient fingers assures that the stake may be readily and easily attached to the heat sink to form a rigid mechanical as well as electrical connection therebetween. It will be further appreciated that since the stake may be adapted to fit almost any conventional heat sink structure, the cost and inconvenience of otherwise modifying or designing and manufacturing heat sinks with solderable tabs is totally obviated. Furthermore, since the stake of the invention may be mass produced by metal stamping or the like, and since only the stake must be pre-tinned, the cost of a heat sink with the solderable clip-on stake of the invention is considerably less than any other presently available solderable stake heat sink.

While the invention has been described with particular reference to a specific sheet metal body folded to form a three-fingered stake, it should be understood that the geometric designs of both the heat sink bodies disclosed herein and the particular stake 10 are not to be considered limitative of the invention. Other geometric designs may be utilized to perform the functions described herein and achieve similar results. While various other geometric designs will lend themselves equally to the functions required, the apparatus described is readily formed with commercially available tools. Likewise, although in the heat sink described in detail herein the semiconductor device is attached to the heat sink with a bolt, it will be readily recognized that the means for attaching the semiconductor enclosure package to the heat sink may take various forms, such as bolts, screws, spring clips or tongue and groove attachments or the like.

It should also be appreciated that although the invention has been described with particular reference to use in connection with the TO-220 plastic power package, the invention is equally suitable for use with other packages of related design. It is to be understood, therefore, that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed:

1. A solderable stake for a heat sink comprising a unitary body formed from an essentially flat rectangular metal body, said body having a pair of cuts extending from opposite edges thereof aligned substantially along a common axis and the portion of the body on one side of said axis folded to form a shank; a base portion transverse to the axis of said shank supported by said shank; a further portion of said body having further cuts extending from the edge opposite said shank along lines substantially parallel with said shank to form a plurality of parallel fingers extending from said base substantially parallel with the axis of said shank but disposed on the opposite side of said base from said shank with said shank and said fingers extending in opposite directions from said base, at least one of said fingers being displaced from the remaining fingers to form therewith and said base a channel adapted to receive a heat sink; and a solderable coating on at least the shank portion of said unitary body.

2. A solderable stake as defined in claim 1 wherein said plurality of fingers is formed by cutting said body along at least two lines parallel with the axis of said shank to form at least three fingers, bending at least one of said fingers approximately 90° from the axis of said shank to form said base, and bending the remaining portion of said at least one finger approximately 90° to extend parallel with but spaced from the plane of the remaining said at least three fingers, thereby forming a plurality of parallel fingers extending from said base spaced apart by the width of said base.

3. A solderable stake as defined in claim 1 wherein the ends of said fingers opposite said base are flared outwardly from said channel.

4. A solderable stake as defined in claim 1 wherein at least one of said fingers includes a barb extending therefrom into said channel adapted to retain a heat sink body within said channel.

5. A solderable stake as defined in claim 1 wherein said shank is formed by cutting said flat metal body to define two oppositely disposed tabs and folding said tabs toward the central portion of said flat metal body, thereby forming a substantially cylindrical shank.

6. A solderable stake as defined in claim 1 wherein said unitary body is tin-plated.

7. The combination comprising:
  (a) a heat sink of thermally conductive material and having a generally flat base portion lying in a first plane;
  (b) means for securing a semiconductor encapsulation package adjacent and in intimate contact with said flat base portion of said heat sink and maintaining the leads extending from said package in a position substantially parallel with said first plane and extending beyond the edge of said heat sink; and
  (c) a solderable stake comprising a unitary body formed from an essentially flat rectangular metal body, said body having a pair of cuts extending from opposite edges thereof aligned substantially along a common axis and the portion of the body on one side of said axis folded to form a shank; a base portion transverse to the axis of said shank supported by said shank; a further portion of said body having further cuts extending from the edge opposite said shank along lines substantially parallel with said shank to form a plurality of parallel fingers extending from said base substantially parallel with the axis of said shank but disposed on the opposite side of said base from said shank with said shank and said fingers extending in opposite directions from said base, at least one of said fingers being displaced from the remaining fingers to form therewith and said base a channel in which an edge of said heat sink is secured with said shank extending from the edge of said heat sink in the same direction as said leads; and a solderable coating on at least the shank portion of said unitary body.

* * * * *